(12) United States Patent
Oku (10) Patent No.: US 8,723,709 B2
(45) Date of Patent: May 13, 2014

(54) DIGITAL-TO-ANALOG CONVERTER

(75) Inventor: Hideki Oku, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/603,983

(22) Filed: Sep. 5, 2012

(65) Prior Publication Data

US 2013/0057420 A1    Mar. 7, 2013

(30) Foreign Application Priority Data

Sep. 22, 2011   (JP) .................. 2011-208186

(51) Int. Cl.
*H03M 1/00*   (2006.01)
*H03M 1/74*   (2006.01)

(52) U.S. Cl.
CPC .............. *H03M 1/745* (2013.01); *H03M 1/742* (2013.01)
USPC .......................... 341/136; 341/144; 341/145

(58) Field of Classification Search
CPC ...................................... H03M 1/742

USPC .................................. 341/144, 145, 136, 119
See application file for complete search history.

(56) References Cited

U.S. PATENT DOCUMENTS 7,403,140 B2 *   7/2008   Miyagi et al. ................. 341/119
2010/0026540 A1   2/2010   Morita et al.

FOREIGN PATENT DOCUMENTS

| JP | 2006-313568 | 11/2006 |
| JP | 2010-35090 | 2/2010 |

* cited by examiner

*Primary Examiner* — Jean B Jeanglaude
(74) *Attorney, Agent, or Firm* — Staas & Halsey LLP (57) ABSTRACT

There is provided a digital-to-analog converter including: a mirror circuit including a first transistor to copy a reference current at a predetermined mirror ratio, and a second transistor cascade coupled with the first transistor; and an analog switch coupled with a gate of the second transistor, the analog switch being configured to be controlled, by a digital signal input from outside, so as to be turned on or off.

15 Claims, 8 Drawing Sheets

DIGITAL-TO-ANALOG CONVERTER

CROSS-REFERENCE TO RELATED APPLICATION

This application is based upon and claims the benefit of priority of the prior Japanese Patent Application No. 2011-208186, filed on Sep. 22, 2011, the entire contents of which are incorporated herein by reference.

FIELD

The embodiments discussed herein are related to a digital-to-analog converter.

BACKGROUND

In a current-output type digital-to-analog conversion circuit, resistors weighted in accordance with bits are connected in parallel via switches. When a certain voltage is applied to the resistors, the total sum of currents flowing through the resistors turned on by the switches is a total current amount, and a current corresponding to an input digital value is output.

Figure 1:
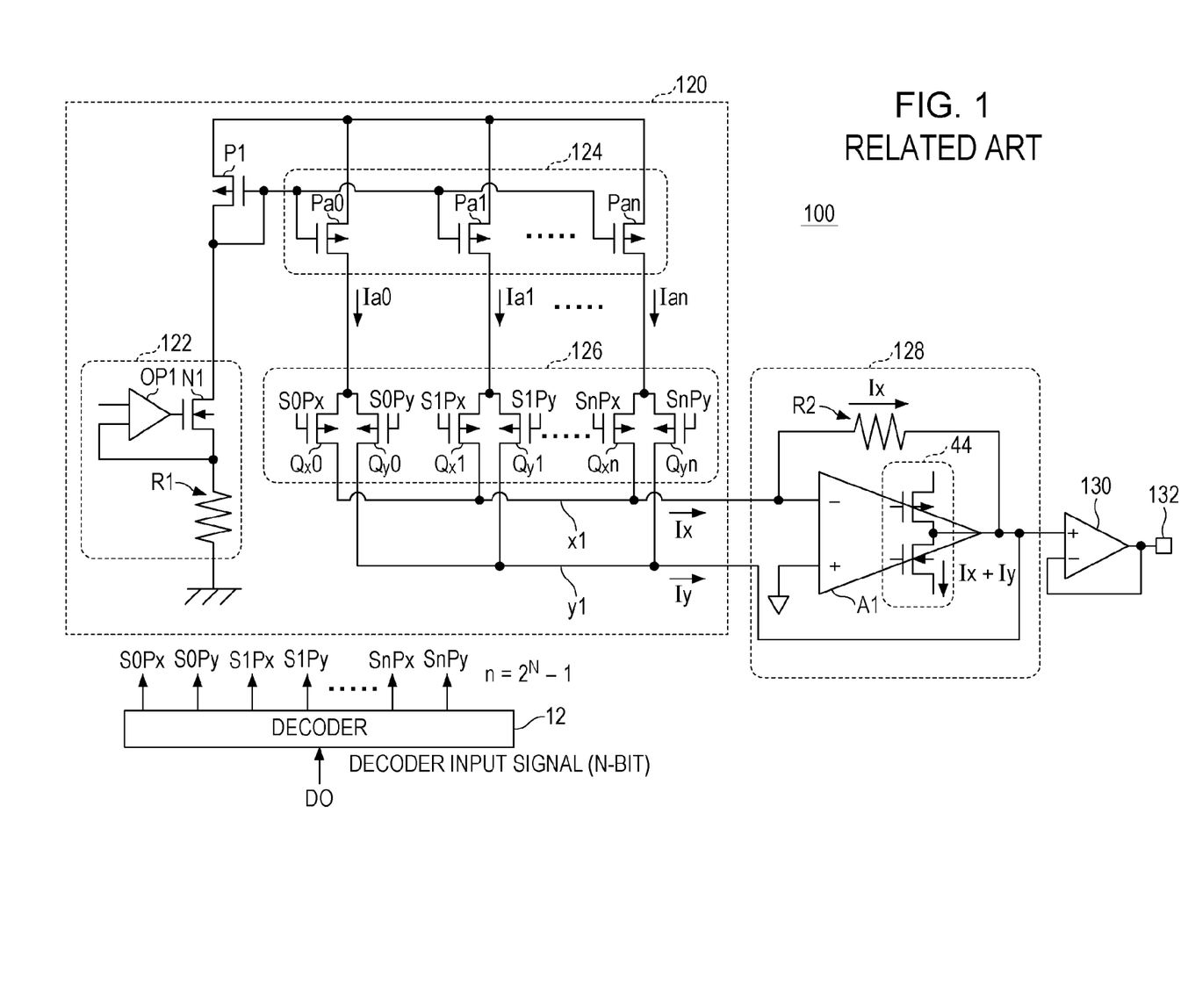
FIG. 1 depicts an example of a conventional configuration (conventional scheme 1) of a current-output type DA converter.

FIG. 1 depicts a digital-to-analog converter (hereinafter referred to as a "DA converter") 100 as a semiconductor integrated circuit. The DA converter depicted in FIG. 1 is referred to as a conventional scheme 1. A current generated by a current source 122 is supplied via a p-channel metal-oxide-semiconductor (PMOS) transistor P1 to a current cell array 124. The drains of PMOS transistors Pa of the current cell array 124 are connected to the corresponding differential switches of a switch group 126. Each differential switch is made up of a pair of PMOS transistors $Q_x i$ and $Q_y i$. Decode signals $SiP_x$ and $SiP_y$ obtained by decoding an input digital signal of N bits are applied to the pair of PMOS transistors $Q_x i$ and $Q_y i$ of the differential switch corresponding to the decode signals $SiP_x$ and $SiP_y$. Through the decode signals $SiP_x$ and $SiP_y$, the differential switch is controlled so as to be turned on or off. In addition, i is 0, 1 to n in FIG. 1.

The drain of the PMOS transistor $Q_x i$ is connected to a current path xi. The drain of the PMOS transistor $Q_y i$ is connected to a current path yi. Either the current path xi or the current path yi is selected depending on whether the differential switch is in the ON state or in the OFF state, and current values for differential switches are added together. Output currents Ix and Iy from the switch group 126 flow through the current paths xi and yi, respectively. The output currents Ix and Iy are converted into a voltage by a current-to-voltage conversion circuit 128, and the voltage passes through a buffer circuit 130 and is output as an analog signal from an output terminal 132.

In the configuration of FIG. 1, voltage drops occur between the sources and drains of the PMOS transistors $Q_x i$ and $Q_y i$ of the differential switch. Moreover, currents Ia0 to Ian flowing through transistors of the current cell array 124 easily vary under the influence of the Early effect. This is because variations in drain voltages Vds of the MOS transistors Pa directly influence the currents Ia0 to Ian.

To reduce current errors due to variations in the drain voltages Vds of the MOS transistors Pa, it is conceivable to replace the current cell array 124 with cascade current mirrors. In this case, as depicted in FIG. 2, voltage drops across MOS transistors become larger.

Figure 2:
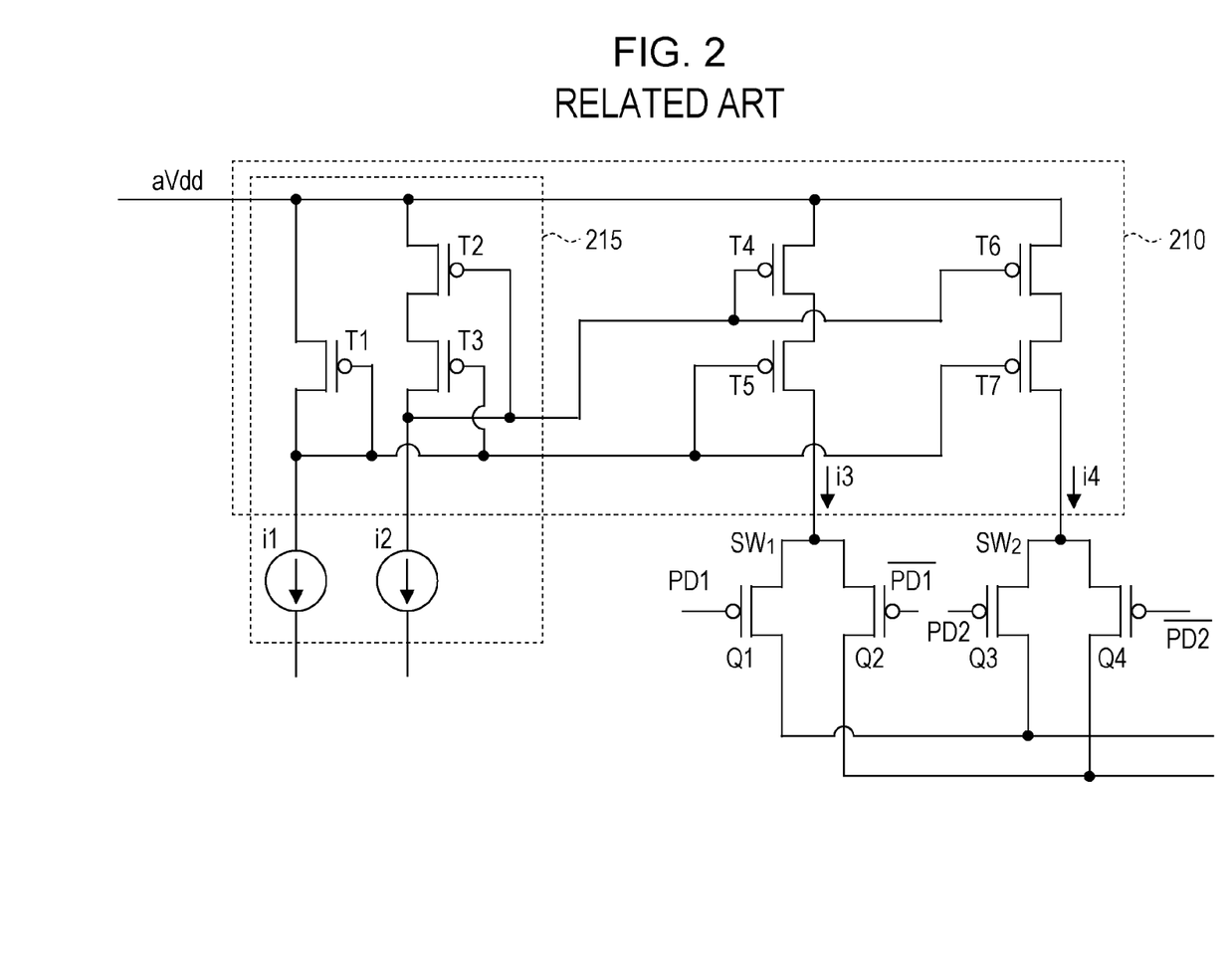
FIG. 2 depicts an example of a conventional configuration (conventional scheme 2) of the current-output type DA converter.

FIG. 2 depicts a configuration in which currents i3 and i4 generated in a cascade current mirror circuit 210 are connected to differential switches $SW_1$ and $SW_2$, respectively. The DA converter depicted in FIG. 2 is referred to as a conventional scheme 2. The differential switch $SW_1$ is made up of a pair of transistors Q1 and Q2. An input digital signal PD1 and its inverse are applied to the gates of the transistors Q1 and Q2, respectively. The differential switch $SW_2$ is made up of a pair of transistors Q3 and Q4. An input digital signal PD2 and its inverse are applied to the gates of the transistors Q3 and Q4, respectively. In a steady current source 215, the gate potential of a transistor T3 is determined by a transistor T1, so that the drain potential of a transistor T2 is fixed. The gate potential of the transistor T2 is applied to the gates of transistors T4 and T6, so that a current i2 is copied. The drain potential of the transistor T4 is fixed by a transistor T5, and the drain potential of the transistor T6 is fixed by a transistor T7. In this way, degradation of current accuracy due to the Early effect is reduced.

With the configuration of FIG. 2, however, voltage drops between the drains and the sources of the transistors Q1 to Q4 used for the differential switches $SW_1$ and $SW_2$ not only occur but also increase by amounts corresponding to the transistors T5 and T7 added to the cascade current mirror circuit 210.

Figure 3:
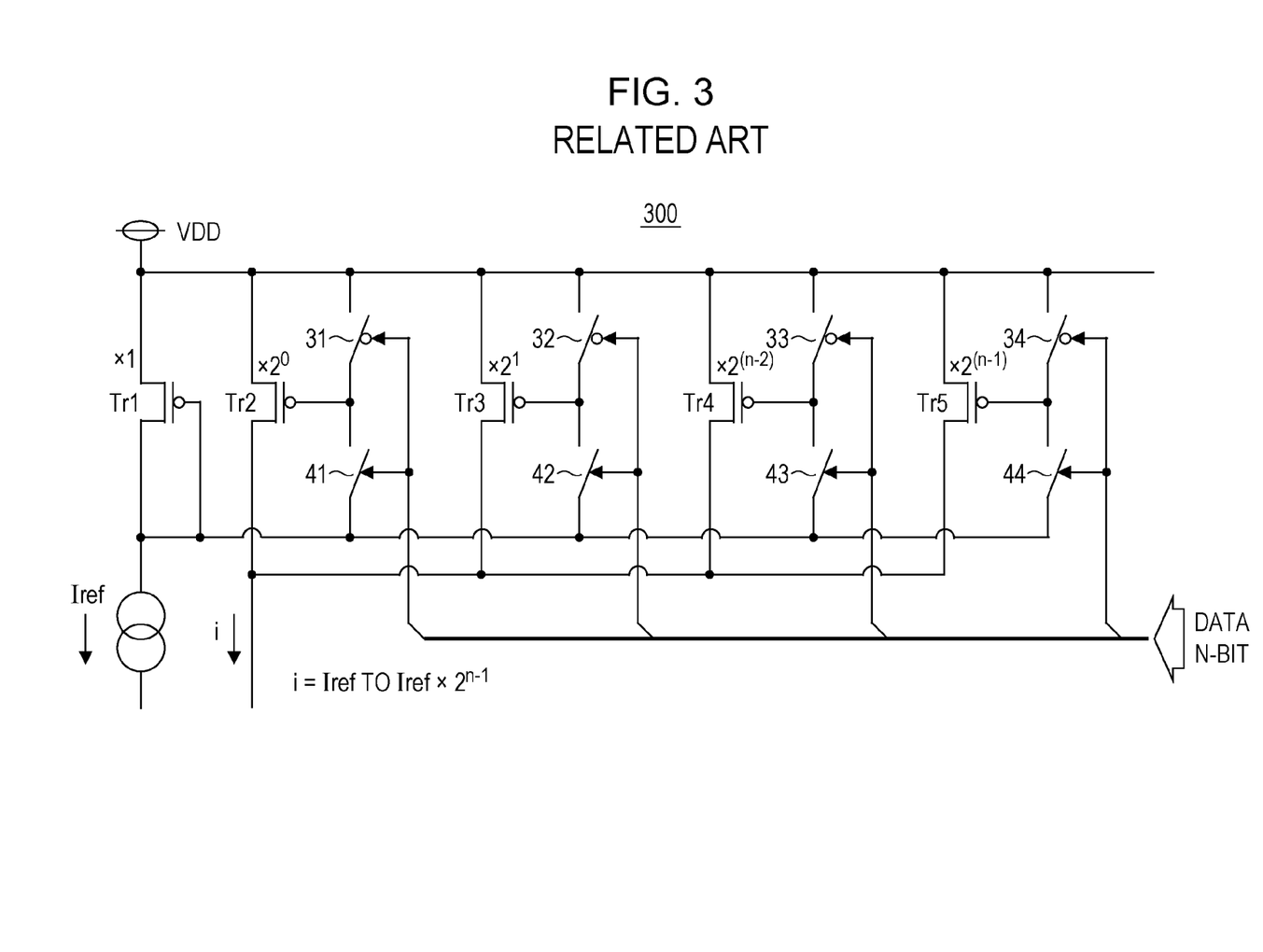
FIG. 3 depicts an example of a configuration (conventional scheme 3) of a current mirror circuit for use in a circuit in which power down operation is performed.

Another configuration using a current mirror circuit for use in a circuit in which power down operation is performed is known. FIG. 3 depicts an example of a configuration of a current mirror circuit 300 using analog switches. The DA converter depicted in FIG. 3 is referred to as a conventional scheme 3. In the current mirror circuit 300, pairs of switches (31, 41), (32, 42), (33, 43), and (34, 44) are arranged for transistors Tr2, Tr3, Tr4, and Tr5, respectively. Each switch is controlled by input data bits so as to be turned on or off, thereby connecting the gate of the corresponding transistor Tr2, Tr3, Tr4, or Tr5 either to a VDD line or to the drain of a transistor Tr1. The transistors Tr2 to Tr5 are formed to have different sizes, and copy a reference current Iref in accordance with their sizes such that the reference current Iref is increased by a factor of $2^{n-1}$. With the configuration of FIG. 3, voltage drops across the switches 41, 42, 43, and 44 directly influence currents flowing through the transistors Tr2 to Tr5, and therefore the mirror ratio accuracy is degraded.

Japanese Laid-open Patent Publication Nos. 2010-35090 and 2006-313568 are examples of the related art.

SUMMARY

According to an aspect of the embodiment, there is provided a digital-to-analog converter including: a mirror circuit including a first transistor to copy a reference current at a predetermined mirror ratio, and a second transistor cascade coupled with the first transistor; and an analog switch coupled with a gate of the second transistor, the analog switch being configured to be controlled, by a digital signal input from outside, so as to be turned on or off.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the accompanying drawings.

First Embodiment

Figure 4:
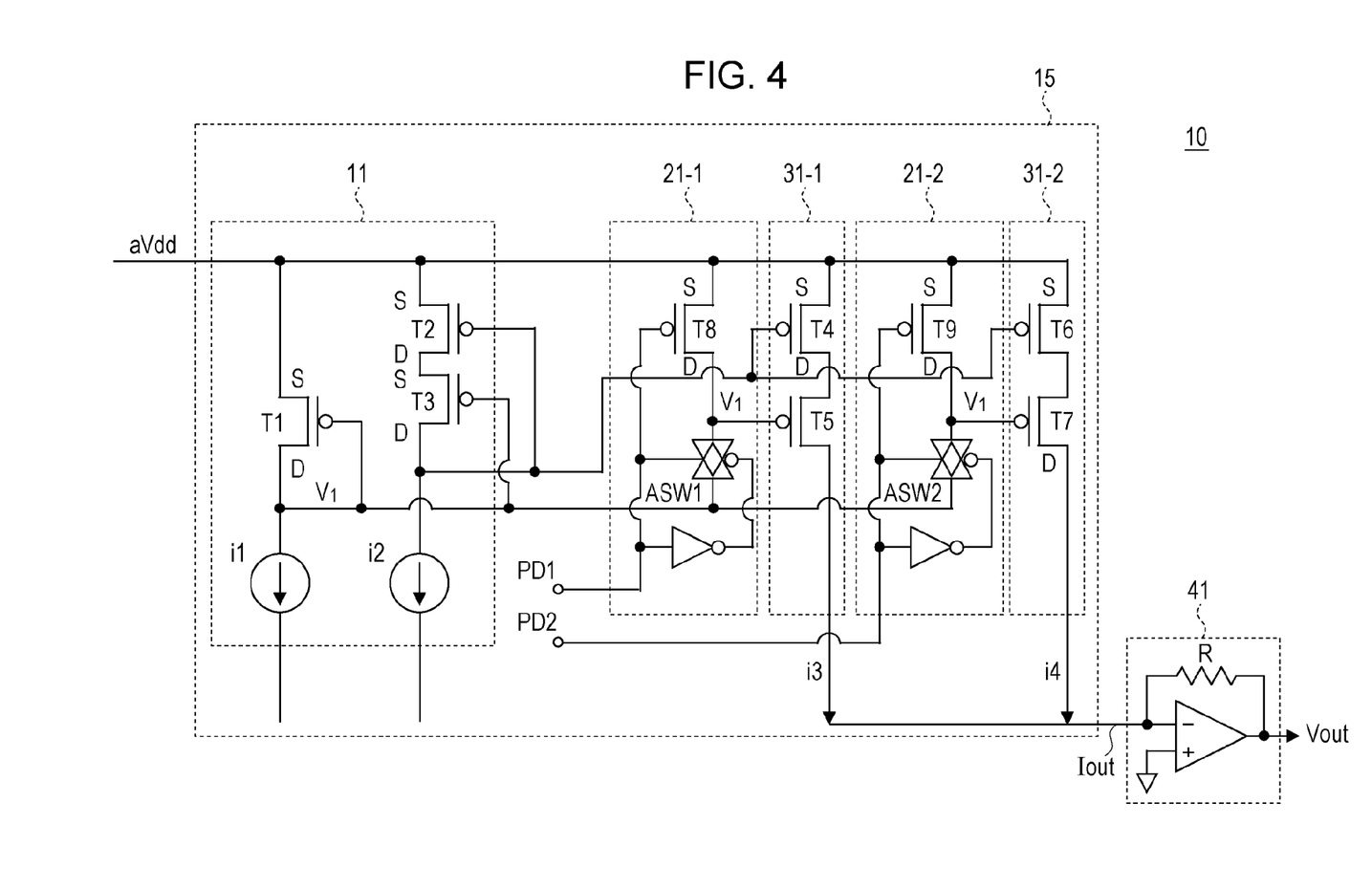
FIG. 4 depicts an example of a configuration of a current-output type DA converter of a first embodiment.

FIG. 4 depicts an example of a configuration of a DA converter 10 of a first embodiment. The DA converter 10 has a current mirror circuit 15. The current mirror circuit 15 includes a current source 11 that generates a reference current, mirror circuits 31-1 and 31-2 that copy the reference current generated in the current source 11 at predetermined ratios, and power down circuits 21-1 and 21-2 having analog switches ASW1 and ASW2 connected to the mirror circuits 31-1 and 31-2. The analog switches ASW1 and ASW2 are controlled by input digital signals PD1 and PD2 so as to be turned on or off.

The mirror circuit 31-1 includes the transistor T4 connected to an analog supply voltage aVdd, and the transistor T5 cascade connected to the transistor T4. The source of the transistor T4 is connected to the analog supply voltage aVdd, and the drain of the transistor T4 is directly connected to the source of the transistor T5. The transistor T4 is a transistor for determining a current flowing through the mirror circuit 31-1, and the channel width is set so that the reference current i2 generated in the current source 11 is copied at a predetermined ratio. The drain potential of the transistor T4 is fixed by the transistor T5. This reduces degradation of mirror accuracy due to the Early effect.

Likewise, the mirror circuit 31-2 includes the transistor T6 connected to the analog supply voltage aVdd, and the transistor T7 cascade connected to the transistor T6. The source of the transistor T6 is connected to the analog supply voltage aVdd, and the drain of the transistor T6 is directly connected to the source of the transistor T7. The transistor T6 is a transistor for determining a current flowing through the mirror circuit 31-2, and the channel width is set so that the reference current i2 generated in the current source 11 is copied at a ratio different from that of the mirror circuit 31-1. The drain potential of the MOS transistor T6 is fixed by the transistor T7. This reduces degradation of mirror accuracy due to the Early effect.

The power down circuit 21-1 includes the analog switch ASW1 and a transistor T8. The analog switch ASW1 is connected to the gate of the transistor T5 cascade connected to the transistor T4 in the mirror circuit 31-1. The source of the transistor T8 is connected to the analog supply voltage aVdd, and the drain is connected to the analog switch ASW1. The analog switch ASW1 is a complementary MOS (CMOS) analog switch having four terminals, for example. The input digital signal PD1 is connected to a control terminal of the analog switch ASW1. The analog switch ASW1 and the transistor T8 are added to the transistor T5 of the mirror circuit 31-1. This implements power down operation as described below.

Likewise, the power down circuit 21-2 includes the analog switch ASW2 and a MOS transistor T9. The analog switch ASW2 is connected to the transistor T7 cascade connected to the transistor T6 in the mirror circuit 31-2. The source of the transistor T9 is connected to the analog supply voltage aVdd, and the drain is connected to the analog switch ASW2. The analog switch ASW2 is a CMOS analog switch having four terminals, like the ASW1. The input digital PD2 is connected to a control terminal of the analog switch ASW2. The analog switch ASW2 and the transistor T9 are added to the transistor T7 of the mirror circuit 31-2. This implements power down operation as described below.

The current source 11 includes the transistor T1 connected to the analog supply voltage aVdd, the transistor T2 connected in parallel with the transistor T1 to the analog supply voltage aVdd, and the transistor T3 connected to the drain of the transistor T2. The transistors T2 and T3 have to operate in their saturated regions in order for the current i2 flowing through the path of the transistors T2 and T3 to be copied in the mirror circuit 31-1 and 31-2. To address this, the gate of the transistor T1 is connected to the gate of the transistor T3, thereby determining the gate potential of the transistor T3. In this way, the drain potential of the MOS transistor T2 is fixed, and the transistors T2 and T3 operate in their saturated regions. The transistor T1 is a transistor for ensuring that the transistors T2 and T3 operate in their saturated regions, and the current i1 flowing through the transistor T1 is equal to the current i2 flowing through the path of the transistors T2 and T3. The gate of the transistor T2 is connected to the drain of the transistor T3. As a result, the voltage between the source of the transistor T2 and the drain of the transistor T3 is smaller than that in a usual cascade current mirror case.

The gate of the transistor T2 of the current source 11 is connected to the gate of the MOS transistor T4 of the mirror circuit 31-1 and the gate of the transistor T6 of the mirror circuit 31-2. The gate potential of the transistor T2 is applied to the transistors T4 and T6, so that the current i2 is copied. The ratio at which the current i2 is copied is determined in accordance with the channel widths of the transistors T4 and T6 as mentioned above. The gate of the transistor T3 of the current source 11 is connected via the analog switch ASW1 to the gate of the transistor T5 of the mirror circuit 31-1, and is also connected via the analog switch ASW2 to the gate of the transistor T7 of the mirror circuit 31-2.

When the transistors T2 and T3 operate in their saturated regions, the transistors T4, T5, T6, and T7 will operate in their saturated regions. Only two mirror circuits 31-1 and 31-2 are depicted for the sake of convenience of drawing in the example of FIG. 4; an arbitrary number of mirror circuits are connected in accordance with the number of bits of an input digital signal. The transistors T1 to T9 for use in the current mirror circuit 15 are electric field effect type MOS transistors, for example.

The input digital signal PD1 is connected to the analog switch ASW1 and the gate of the transistor T8 of the power down circuit 21-1. The input digital signal PD2 is connected to the analog switch ASW2 and the gate of the transistor T9 of the power down circuit 21-2. The input digital signals PD1 and PD2 control the analog switches ASW1 and ASW2, so that the analog switches ASW1 and ASW2 are turned on or off, respectively. By turning on or off the analog switches ASW1 and ASW2, the transistors T5 and T7 are controlled so as to be turned on or off, so that the currents i3 and i4 flowing through the mirror circuits 31-1 and 31-2 are controlled. The sum of the currents i3 and i4 is an output current Iout of the current mirror circuit 15. The output current Iout is converted into a voltage in a current-to-voltage converter 41. An output Vout of the current-to-voltage converter 41 is an analog voltage signal corresponding to the value of an input digital signal, and is an output of the DA converter 10.

Operation of the DA converter 10 of FIG. 4 will be described. When the input digital signal PD1 input to the power down circuit 21-1 has a high potential, the analog switch ASW1 enters the ON state (low impedance state), and the transistor T8 is turned off. This is because the voltage between the gate and the source of the transistor T8 becomes 0 V.

When the analog switch ASW1 is turned on, a drain potential $V_1$ of the transistor T1 is applied to the gate of the transistor T5 of the mirror circuit 31-1. That is, the gate potential of the transistor T5 becomes equal to the drain potential of the transistor T1. In this situation, the current i3 determined in the transistor T4 flows. Since the drain potential of the transistor T4 is fixed by the transistor T5, variations in the current i3 are inhibited.

The transistor T5 stabilizes the drain potential of the transistor T4 that determines the current, and is used as a gate switch that changes the current flowing through the mirror circuit 31-1. Accordingly, unlike conventional configurations, an additional switch for changing the current i3 generated in the mirror circuit is unnecessary. A voltage drop caused by providing an additional switch is avoided.

When the input digital signal PD1 has a low potential, the analog switch ASW1 enters the OFF state (high impedance state), and the transistor T8 is turned on. This is because the voltage between the gate and the source of the transistor T8 becomes equal to the analog supply voltage aVdd. When the analog switch ASW1 is turned off, the transistor T5 of the mirror circuit 31-1 is also turned off. In this situation, the current i3 does not flow. As such, the power down circuit 21-1 is in a high impedance state, and the mirror circuit 31-1 is in a power down state.

Any operation similar to the above applies to the power down circuit 21-2 to which the input digital signal PD2 is input, and the mirror circuit 31-2.

Figure 5:
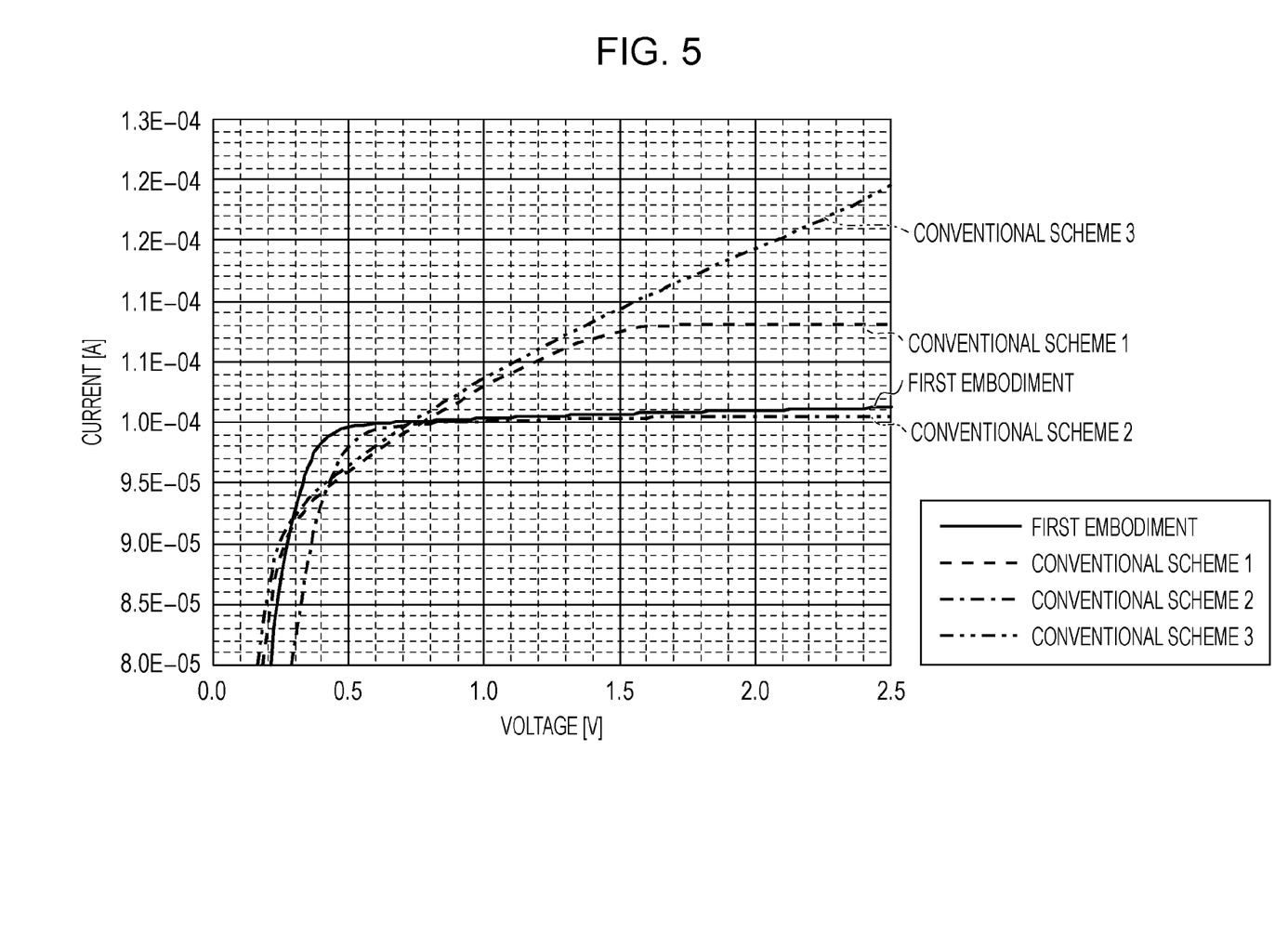
FIG. 5 is a graph representing effects of the first embodiment compared to those of conventional schemes 1 to 3.

FIG. 5 is a graph that compares current-voltage characteristics of the DA converter 10 of the first embodiment depicted in FIG. 4 to those of conventional schemes 1 to 3. With the configuration of the first embodiment indicated by a solid line, the output current of the current-output type DA converter 10 is steady and stable. With this configuration, the voltage for obtaining a given current output is the lowest. This achieves a reduction in voltage of the entire DA converter 10. That is, using the same output current as in the conventional schemes, a voltage applied to a circuit connected at a stage subsequent to the DA converter 10 is larger than those in the conventional schemes (the power of an analog output signal is increased).

In conventional scheme 1 of FIG. 1 indicated by a dotted line, a large voltage is used so that the output current is made steady. In the current cell array 124 of conventional scheme 1, the drain current varies under the influence of the Early effect, resulting in poor current accuracy. A large voltage is used so as to make the influence of the variations of the drain current relatively small so that the voltage is made stable. Conventional scheme 1 is also under the influence of a voltage drop across the switch 126. A large voltage is used so as to make the influence of a voltage drop across the switch 126 relatively small.

In conventional scheme 2 of FIG. 2 indicated by a dashed dotted line, since the current accuracy is increased using the cascade mirror circuit 210, the current value is steady as in the first embodiment. Compared to the first embodiment, however, a large voltage is used. This difference in voltage corresponds to voltage drops between the sources and drains of the switches SW connected in series to the cascade mirrors.

In conventional scheme 3 indicated by a two-dot chain line, since voltage drops of the analog switches 41, 42, 43, and 44 directly influence the transistors Tr2, Tr3, Tr4, and Tr5, the output current is not steady.

As such, the configuration of the first embodiment has effects in that operation is performed at a low voltage, and the output current is stable. Such effects are particularly useful in low-voltage cascade mirrors.

Second Embodiment

Figure 6:
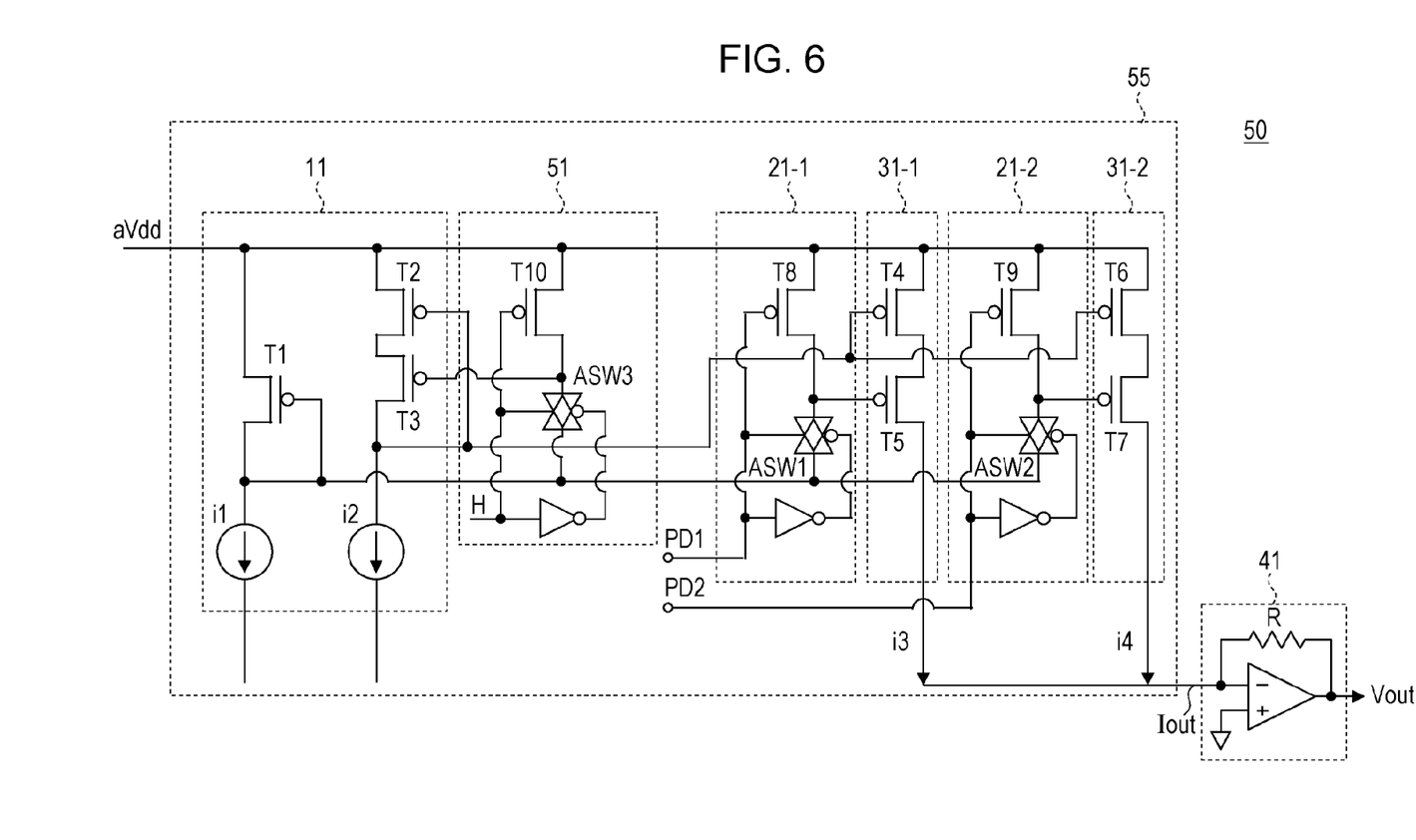
FIG. 6 depicts an example of a configuration of a current-output type DA converter of a second embodiment.

FIG. 6 depicts a configuration of a current-output type DA converter 50 of a second embodiment. In the second embodiment, a dummy circuit 51 including a dummy analog switch ASW3 is connected, so that the influence of voltage drops of the analog switches ASW1 and ASW2 is removed.

In a current mirror circuit 55, ideally, the gate potential of the transistor T5 cascade connected to the transistor T4 in the mirror circuit 31-1 as well as the gate potential of the transistor T7 cascade connected to the transistor T6 in the mirror circuit 31-2 are equal to the gate potential of the transistor T3 of the current source 11. This is because the gate potential of the transistor T3 that is generated by the transistor T1 is preferably reflected in the transistors T5 and T7 so that the transistors T5 and T7 operate in their saturated regions.

However, when the analog switches ASW1 and ASW2 are made of MOS transistors, it is undeniable that a voltage drop occurs between the source and the drain of each of the transistors. With the configuration of the first embodiment, there is a possibility that, as a result of voltage drops across the analog switches ASW1 and ASW2, the gate potentials of the transistors T5 and T7 differ from the gate potential of the transistor T3. When the gate potentials of the transistors T5 and T7 vary, the drain potentials of the transistors T4 and T6 that determine currents also become different from the drain potential of the transistor T2. The current accuracy might be degraded by the variations of the drain currents.

To address this, the dummy circuit 51 is used in the second embodiment, so that the influence of the voltage drops across the analog switches ASW1 and ASW2 is removed. The dummy circuit 51 includes the dummy analog switch ASW3 and a dummy transistor T10, and is connected in parallel with the power down circuits 21-1 and 21-2. The source of the dummy transistor T10 is connected to the analog supply voltage aVdd, and the drain is connected to the dummy analog switch ASW3. An intermediate node between the dummy transistor T10 and the dummy analog switch ASW3 is connected to the gate of the transistor T3 of the current source 11. A dummy signal is input to the dummy circuit 51 at the same timing as the input digital signals PD1 and PD2.

The gate of the transistor T3 is connected via the dummy analog switch ASW3 to the drain of transistor T1. The dummy analog switch ASW3 produces a source-drain potential difference whose magnitude is the same as those of the analog switches ASW1 and ASW2.

A signal having a high potential is at all times input to a control terminal of the dummy analog switch ASW3 and the gate of the transistor T10. When a dummy signal is input, the dummy analog switch ASW3 is turned on, and the transistor T10 is turned off. A potential obtained by subtracting a potential corresponding to a voltage shift of the dummy analog switch ASW3 from the drain potential of the transistor T1 is applied to the gate of transistor T3.

When the input digital signal PD1 supplied to the power down circuit 21-1 has a high potential, the analog switch ASW1 is turned on, so that the drain potential of the transistor T1 is applied to the gate of the transistor T5. In this case, the potential obtained by subtracting a potential corresponding to a voltage drop occurring across the analog switch ASW1 from the original drain potential is applied to the gate of the transistor T5. Since the voltage drop equal to the voltage drop across the analog switch ASW1 occurs across the dummy analog switch ASW3, the gate potential of the transistor T5 is equal to the gate potential of the transistor T3. Considerations similar to the above apply to the analog switch ASW1 and the transistor T7 of the power down circuit 21-2.

The gate potential of the transistor T3 has to be equal to the gate potential of each of the transistors T5 and T7; the gate potential of the transistor T3 does not have to be equal to the drain potential of the transistor T1. When the gate potential of the transistor T3 is equal to that of each of the transistors T5 and T7, the drain potential of the transistor T2 is equal to the drain potential of each of the transistors T4 and T6. Thus, currents flowing through the mirror circuits 31-1 and 31-2 are made stable, which improves current accuracy.

Figure 7:
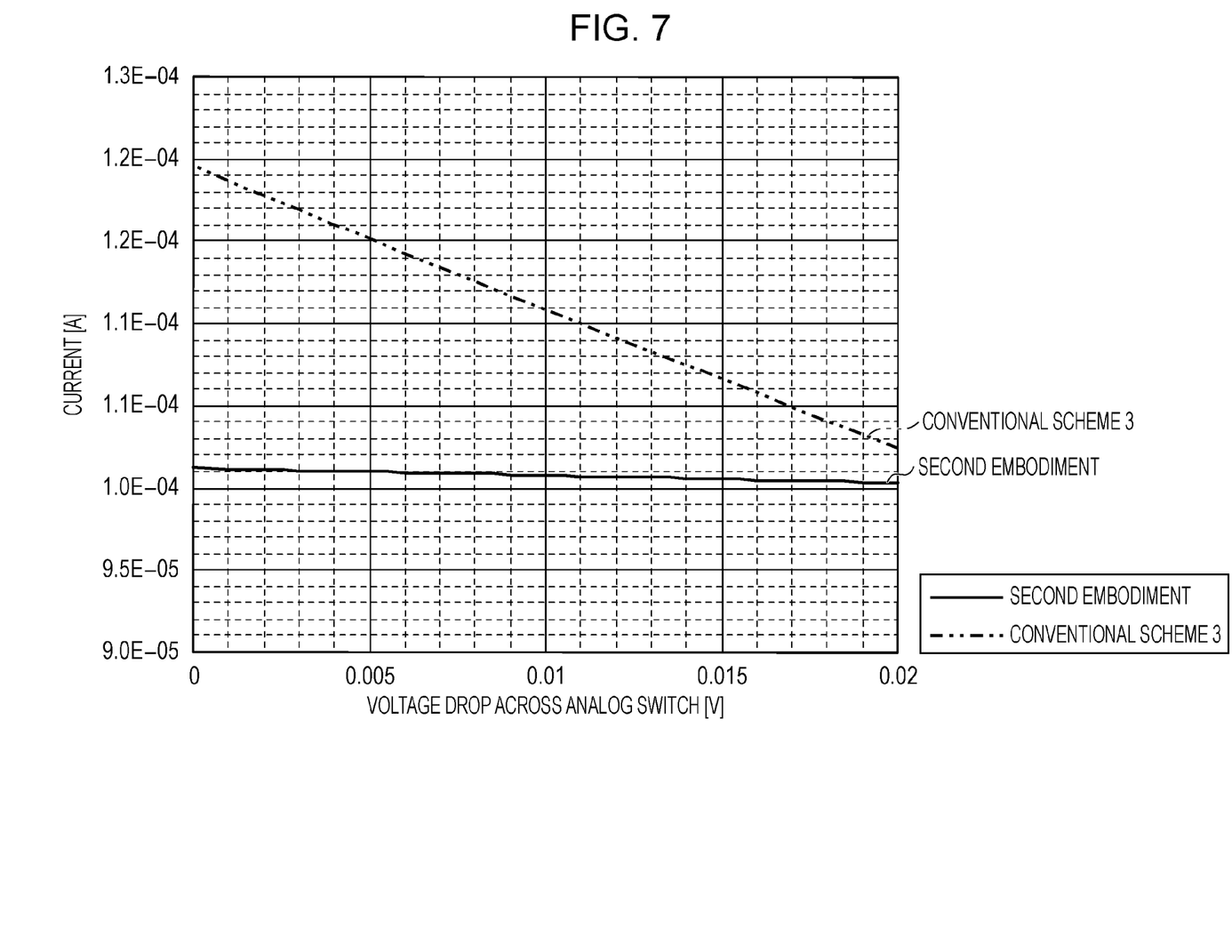
FIG. 7 is a graph representing effects of the second embodiment compared to those of conventional scheme 3.

FIG. 7 is a graph representing effects of the second embodiment compared to those of the analog switch of conventional scheme 3. In the circuit of conventional scheme 3 of FIG. 3, voltage drops across the analog switches 41, 42, 43, and 44 directly influence currents flowing through the transistors Tr2, Tr3, Tr4, and Tr5. For this reason, as depicted in FIG. 7, a voltage drop across an analog switch directly leads to a decrease in output current.

In contrast, in the circuit of the second embodiment, if voltage drops occur across the analog switches ASW1 and ASW2, the gate potentials of the transistors T5 and T7 are maintained at the same level as the gate potential of the transistor T3 owing to the existence of the dummy analog switch ASW3. Accordingly, the drain potentials of the transistors T4 and T6 are made stable, and a stable current output is achieved as indicated by a solid line in FIG. 7.

Third Embodiment

Figure 8:
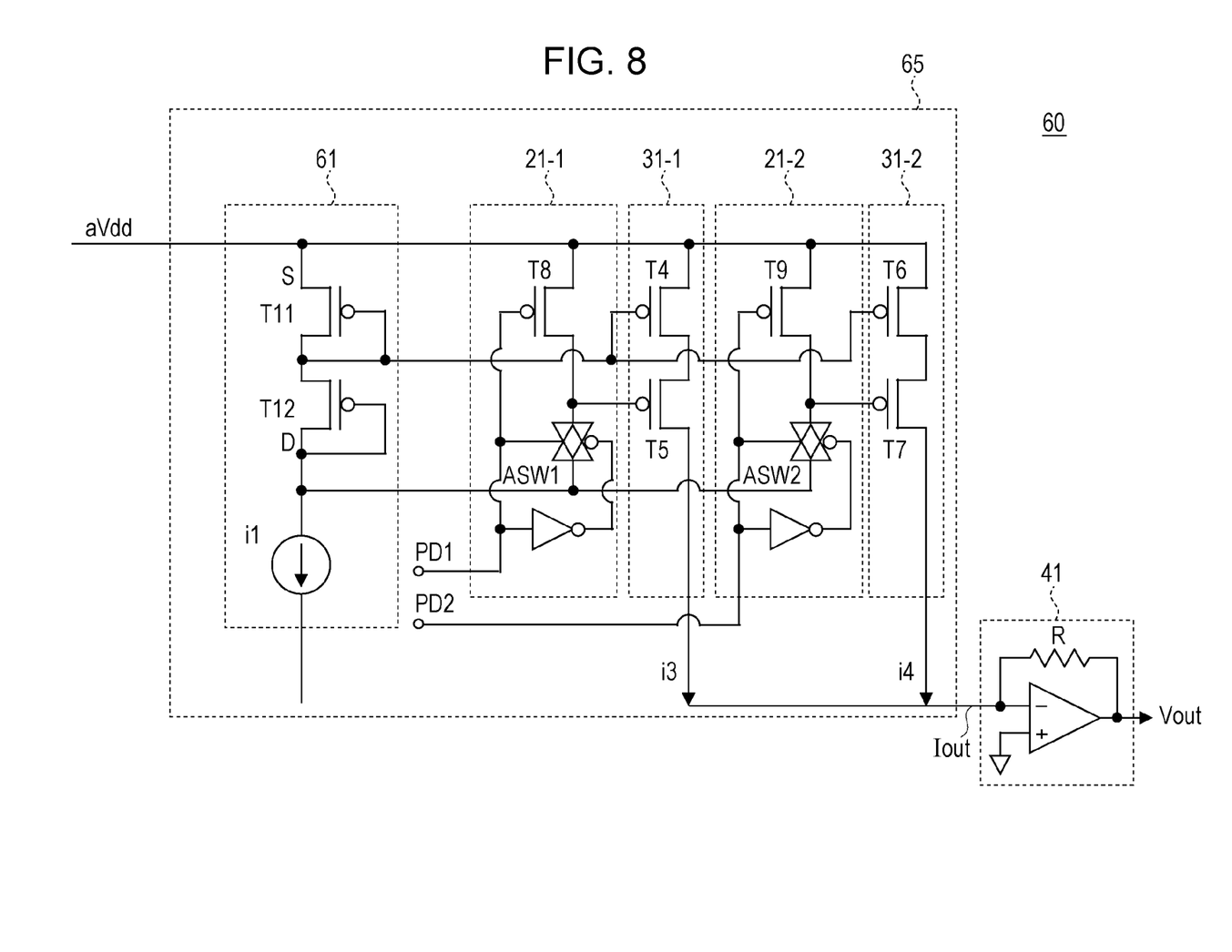
FIG. 8 depicts an example of a configuration of a DA converter of a third embodiment.

In a third embodiment, a configuration similar to that of the current-output type DA converter 10 of the first embodiment is employed. However, the configuration of a current source differs from that of the first embodiment. The same elements as in the first embodiment are denoted by the same reference characters, and the same description is omitted.

A current source 61 of a current mirror circuit 65 in a DA converter 60 includes transistors T11 and T12. The source of the transistor T11 is connected to the analog supply voltage aVdd, and the drain is connected to the source of the transistor T12. The gate of the transistor T11 is connected to its drain. The gate of the transistor T12 is connected to its drain. In this way, a voltage between the source of the transistor T11 and the drain of the transistor T12 becomes small.

The gate potential of the transistor T11 is connected to the gate of the transistor T4 of the mirror circuit 31-1 and the gate of the transistor T6 of the mirror circuit 31-2, and the current i1 is copied at predetermined mirror ratios. The drain potential of the transistor T12 is connected via the analog switch ASW1 to the gate of the transistor T5 of the mirror circuit 31-1, and is also connected via the analog switch ASW2 to the gate of the transistor T7 of the mirror circuit 31-2.

When the input digital signal PD1 has a high potential, the drain potential of the transistor T12 is applied to the gate of the transistor T5, so that the current i3 flows. Likewise, when the input digital signal PD1 has a high potential, the drain potential of the transistor T12 is applied to the gate of the transistor T7, so that the current i4 flows. Since the transistors T5 and T7 of the mirror circuits 31-1 and 31-2 function also as gate switches owing to the existences of the analog switch ASW1 and ASW2, there is no voltage drop caused by addition of a switch. This is the same as in the first and second embodiments. The drain potentials of the transistors T4 and T6 are fixed by the transistors T5 and T7, and variations of the drain currents are controlled for this reason. This is also the same as in the first and second embodiments.

The dummy circuit of the second embodiment may be combined with the circuit of the third embodiment. Each of the numbers of the mirror circuits 31 and the power down circuits 21 connected in parallel with the current source 11 is not limited to two. The current voltage conversion circuit may employ an arbitrary configuration.

The DA converters of the First to Third Embodiments are practicable to achieve low-voltage operation and to increase mirror current accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A digital-to-analog converter comprising:
    a mirror circuit including a first transistor to copy, at a predetermined mirror ratio, a reference current generated from another transistor, and a second transistor cascade coupled with the first transistor; and
    an analog switch coupled with a gate of the second transistor, the analog switch being configured to be controlled, by a digital signal input from outside, so as to be turned on or off.

2. The digital-to-analog converter according to claim 1, further comprising:
    a third transistor used for generation of the reference current,
    wherein a gate of the second transistor is coupled with a gate of the third transistor via the analog switch.

3. The digital-to-analog converter according to claim 2, further comprising:
    a fourth transistor to generate a gate potential of the third transistor,
    wherein the gate of the third transistor is coupled with a drain of the fourth transistor via the analog switch.

4. The digital-to-analog converter according to claim 3, further comprising:
    a dummy analog switch coupled with the gate of the third transistor, the dummy analog switch being configured to be turned on.

5. The digital-to-analog converter according to claim 1, wherein the analog switch is turned on to cause the second transistor to be conducted, when the digital signal has a high potential.

6. The digital-to-analog converter according to claim 1, wherein the analog switch is turned off to power down the second transistor, when the digital signal has a low potential.

7. The digital-to-analog converter according to claim 3, wherein the analog switch is turned on to apply the drain potential of the third transistor to the gate of the second transistor, when the digital signal has a high potential.

8. The digital-to-analog converter according to claim 3, further comprising:
a fifth transistor cascade coupled with the third transistor, the fifth transistor being configured to generate the reference current,
wherein a gate of the first transistor is coupled with a gate of the fifth transistor.

9. The digital-to-analog converter according to claim 1, further comprising:
a sixth transistor coupled with each of the gate of the third transistor and the dummy analog switch, the sixth transistor being configured to receive the digital signal,
wherein the sixth transistor is turned off when the digital signal has a high potential.

10. The digital-to-analog converter according to claim 9, wherein the dummy analog switch and a drain of the sixth transistor is coupled with the gate of the third transistor, and the digital signal is applied to a gate of the sixth transistor.

11. The digital-to-analog converter according to claim 1, wherein two or more combinations of the mirror circuits and the analog switches are connected in parallel.

12. The digital-to-analog converter according to claim 11, further comprising:
a current-to-voltage converter configured to convert, into a voltage, a total sum of currents output from the two or more mirror circuits.

13. A semiconductor integrated circuit comprising:
a first transistor to copy a reference current, at a predetermined mirror ratio, generated from another transistor;
a second transistor cascade coupled with the first transistor; and
an analog switch coupled with a gate of the second transistor, the analog switch being configured to be controlled, by a signal input from outside, so as to be turned on or off, and configured to control the second transistor so that the second transistor is turned on or off.

14. A digital-to-analog converter comprising:
a mirror circuit configured to include a first transistor to copy a reference current at a predetermined mirror ratio, and a second transistor cascade coupled with the first transistor;
a third transistor used for generation of the reference current;
a fourth transistor to generate a gate potential of the third transistor;
a fifth transistor cascade coupled with the third transistor, the fifth transistor being configured to generate the reference current; and
an analog switch coupled with a gate of the second transistor, the analog switch being configured to be controlled by a digital signal input from outside so as to be turned on or off,
wherein the gate of the second transistor is coupled with a gate of the third transistor via the analog switch,
wherein the gate of the third transistor is coupled with a drain of the fourth transistor via the analog switch, and
wherein a gate of the first transistor is coupled with a gate of the fifth transistor.

15. The digital-to-analog converter according to claim 14, comprising;
a sixth transistor coupled with the gate of the third transistor, the sixth transistor being configured to receive the digital signal; and
a dummy analog switch coupled with each of the gate of the third transistor and a drain of the sixth transistor, the dummy analog switch being configured to be receive the digital signal,
wherein the sixth transistor is turned off and the dummy analog switch is turned on, when the digital signal has a high potential.

* * * * *